(12) United States Patent
Polizzi et al.

(10) Patent No.: US 9,767,907 B2
(45) Date of Patent: Sep. 19, 2017

(54) ROW DECODER FOR A NON-VOLATILE MEMORY DEVICE, HAVING REDUCED AREA OCCUPATION

(71) Applicant: STMicroelectronics S.R.L., Agrate Brianza (IT)

(72) Inventors: Salvatore Polizzi, Palermo (IT); Giovanni Campardo, Bergamo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/083,056

(22) Filed: Mar. 28, 2016

(65) Prior Publication Data

US 2017/0084334 A1 Mar. 23, 2017

(30) Foreign Application Priority Data

Sep. 18, 2015 (IT) .................. 102015000053069

(51) Int. Cl.
| | |
|---|---|
| *G11C 7/00* | (2006.01) |
| *G11C 16/08* | (2006.01) |
| *G11C 16/24* | (2006.01) |
| *G11C 16/10* | (2006.01) |
| *G11C 8/10* | (2006.01) |

(52) U.S. Cl.
CPC .............. *G11C 16/08* (2013.01); *G11C 8/10* (2013.01); *G11C 16/10* (2013.01); *G11C 16/24* (2013.01)

(58) Field of Classification Search
None
See application file for complete search history.

(56) References Cited

U.S. PATENT DOCUMENTS

| | | | |
|---|---|---|---|
| 5,410,508 A | * | 4/1995 | McLaury ................. G11C 8/08 |
| | | | 365/189.09 |
| 6,111,792 A | | 8/2000 | Oku et al. |
| | | (Continued) | |

OTHER PUBLICATIONS

Campardo, "3. Deversi tipi di decodifiche di riga," in *Pregettazione De Memorie Non Volatili*, FrancoAngeli, 2002, pp. 199-205.

(Continued)

*Primary Examiner* — Son Dinh
*Assistant Examiner* — Sultana Begum
(74) *Attorney, Agent, or Firm* — Seed IP Law Group LLP

(57) ABSTRACT

A row decoder for a non-volatile memory device includes an input and pre-decoding module that receives address signals and generates pre-decoded address signals. A decoding module receives the pre-decoded address signals for generation on an output of decoded address signals. A driving module generates biasing signals for biasing wordlines of a memory array. The decoding module envisages a plurality of decoding stages, each of which carries out an operation of an OR logic combination between a first and a second predecoded address signal to be combined. The decoding module includes at least one first pass transistor for selectively transferring onto the output the one between the first and second predecoded address signals to be combined in a first operating condition. The decoding module includes at least one first pull-up transistor to selectively bring the output to a high state in at least one second operating condition.

22 Claims, 9 Drawing Sheets

(56) References Cited

U.S. PATENT DOCUMENTS

| | | | |
|---|---|---|---|
| 2006/0146639 A1* | 7/2006 | Fasoli | G11C 8/10 365/230.06 |
| 2007/0030741 A1* | 2/2007 | Nii | G11C 5/06 365/189.11 |
| 2010/0054032 A1* | 3/2010 | De Sandre | G11C 8/08 365/163 |
| 2010/0157670 A1* | 6/2010 | Chevallier | G11C 13/0007 365/185.2 |
| 2013/0301348 A1 | 11/2013 | Perroni et al. | |

OTHER PUBLICATIONS

Cappelletti et al. (eds.), "Chapter 5.2—Read Path: Decoding," in *Flash Memories, Kluwer Academic Publishers*, 1999, pp. 257-259.

\* cited by examiner

ROW DECODER FOR A NON-VOLATILE MEMORY DEVICE, HAVING REDUCED AREA OCCUPATION

BACKGROUND

Technical Field

The present disclosure relates to a row decoder, having a reduced area occupation, for a non-volatile memory device, in particular of a flash type, for addressing and biasing rows of the corresponding memory array.

Description of the Related Art

In a known way, and as illustrated schematically in FIG. 1, a non-volatile memory device, designated by 1, for example of a NAND or NOR flash type, generally comprises a memory array 2 made up of a plurality of memory cells 3, arranged in rows (wordlines WL) and columns (bitlines BL).

Each memory cell 3 is constituted by a storage element formed by a floating-gate transistor, with its gate terminal designed to be coupled to a respective wordline WL, a first conduction terminal designed to be coupled to a respective bitline BL, and a second conduction terminal connected to a reference potential (for example, ground GND). In particular, the gate terminals of the memory cells 3 of the same wordlines WL are connected together.

In a way not shown, the memory array 2 is generally arranged in a plurality of sectors, each of which comprises a plurality of memory cells 3. Each sector has a plurality of respective wordlines WL, distinct from those of the other sectors and physically connected to the memory cells 3 present in the same sector.

A column decoder 4 and a row decoder 5 allow selection, on the basis of address signals received at input (generated in a per se known manner and designated as a whole by AS—"Address Signal", $AS_r$ for the rows, and $AS_c$ for the columns), of the memory cells 3, and in particular of the corresponding wordlines WL and bitlines BL each time addressed in the various sectors, enabling biasing thereof at appropriate voltage and current values during memory operations.

The column decoder 4 may further be configured to provide internally two paths towards the bitlines BL of the memory array 2 each time selected: a reading path, for defining a conductive path between the selected bitline BL and a sense-amplifier stage 7, designed to compare the current flowing in the addressed memory cell 3 with a reference current in order to determine the datum stored; and a programming path, for creating a conductive path between the selected bitline BL and a driving stage 8, configured to supply the required biasing quantities.

In the specific case of non-volatile memories of a flash type, it is known that memory operations require high values of the biasing voltage applied to the wordlines WL, for example a boosted voltage (high voltage, HV) of 4.5 V, during reading operations. These values of the biasing voltages are generated within the memory device by charge-pump stages, which generate a boosted voltage starting from a supply voltage Vdd with logic value, for example a low voltage (LV) of 1.2 V.

The row decoder 5 thus usually has a configuration with a low-voltage portion (i.e., a portion operating with voltages in the region of the supply voltage $V_{dd}$, for example 1.2 V) and a high-voltage portion (i.e., a portion operating in the high-voltage range, i.e., with voltages in the region of the boosted voltage, for example 4.5 V), which is to be coupled to the wordlines WL of the memory array 2 for supplying the required biasing quantities. Level shifters are used for shifting the low-voltage signals (for example, 1.2 V) of the first portion of the row decoder 5 to high-voltage signals (for example, 4.5 V) of the second portion of the row decoder 5.

As illustrated schematically in FIG. 2, in a known embodiment, the row decoder 5 includes an input module 10, which receives the row address signals $AS_r$, digital signals having a certain number of bits, from an input-address bus 11, and appropriately groups together the bits of the same row address signals $AS_r$ into subsets, in order to generate low-voltage grouped address signals $PAS_{LV}$.

The row decoder 5 further includes a pre-decoding module 12, which receives the grouped address signals $PAS_{LV}$ and combines them logically in an appropriate way, to generate low-voltage pre-decoded address signals $\overline{PAS}_{LV}$, on a first transport bus 13, which includes a certain number of lines, each of which corresponding to a respective combination of the grouped address signals $PAS_{LV}$.

Through the aforesaid first transport bus 13, the low-voltage pre-decoded address signals $\overline{PAS}_{LV}$ then reach a voltage-booster module 14, which receives at input the low-voltage pre-decoded address signals $\overline{PAS}_{LV}$ and generates high-voltage pre-decoded address signals $PAS_{HV}$ on a second transport bus 15, which includes a number of lines corresponding to the number of lines of the first transport bus 13.

The row decoder 5 further includes a decoding module 16, which receives the pre-decoded address signals $PAS_{HV}$ and combines them logically in an appropriate way for generating decoded address signals $DAS_{HV}$, which are also high-voltage signals, on an output bus 17, which includes a number of lines corresponding to the number of wordlines WL of the addressed sector of the memory array 2. A driving module 18, which receives the decoded address signals $DAS_{HV}$ from the output bus 17 and generates appropriate high-voltage biasing signals S_WL for the respective wordlines WL of the sector of the memory array 2, so as to perform addressing and biasing of the corresponding memory cells 3.

Row-decoder architectures 5 substantially similar to what described above are illustrated for example in:

P. Cappelletti, C. Golla, P. Olivo, E. Zanoni, "Flash Memories", Kluver Academic Publishers, 1999, Chapter 5.2;

G. Campardo, "Progettazione di memorie non volatili", Franco Angeli 2002, pp. 199-205, which is incorporated herein by reference, in its entirety.

In greater detail, and with reference to FIG. 3, in a known embodiment of such a row decoder 20, the row address signals $AS_r$ (for example, nine-bit digital signals) are received by the input module 10 of the row decoder 5 and grouped appropriately into subsets in order to generate the grouped address signals $PAS_{LV}$, here designated by way of example as: px (referred to in what follows "as first address signals"), lx (referred to in what follows as "second address signals") and ly (referred to in what follows as "third address signals").

For instance, considering a row address signal $AS_r<8:16>$, the first address signals px may correspond to the three bits $AS_r<8:10>$, the second address signals lx may correspond to the two bits $AS_r<11:12>$, and the third address signals ly may correspond to the remaining four bits $AS_r<13:16>$.

The input stage 10 further generates, based on the row address signals $AS_r$, fourth address signals ls.

For instance, the fourth address signals ls may indicate the sector of the memory array 2 that is to be selected, the first address signals px may indicate a block (in the example, of eight wordlines WL) to be addressed within the sector, and the second and third address signals lx and ly may indicate the specific wordlines WL to be addressed within the selected block.

The pre-decoding module 12 comprises a plurality of first logic gates 24, of a two-input, one-output NAND type, each of which receives at the inputs a respective first address signal px and a respective fourth address signal ls and supplies at the output a respective first low-voltage pre-decoded address signal, here designated by psx.

In the example described, the first logic gates 24 are eight in number (i.e., in a number equal to the number of combinations that may be obtained starting from the address signals received at the input).

The pre-decoding module 12 further comprises a plurality of second logic gates 25, of a three-input, one-output NAND type, each of which receives at the inputs a respective second address signal lx, a respective third address signal ly, and a respective fourth address signal ls, and supplies at the output a second low-voltage pre-decoded address signal, here designated by sxy.

In the example described, the second logic gates 25 are sixty-four in number (i.e., once again in a number equal to the number of combinations that may be obtained starting from the address signals received at the input).

The first transport bus 13 comprises in this case eight lines for the first low-voltage pre-decoded address signals psx, and sixty-four lines for the second low-voltage pre-decoded address signals sxy, which are received at the input of the booster module 14.

The booster module 14 comprises a plurality of first booster stages 26, each having an input that receives a respective first low-voltage pre-decoded address signal psx and an output that supplies a respective first pre-decoded address signal psxhv, having a high voltage. In the example, the first booster stages 26 are in a number equal to eight.

The booster module 14 further comprises a plurality of second booster stages 27, each having an input that receives a respective second low-voltage pre-decoded address signal sxy and an output that supplies a respective second pre-decoded address signal sxyhv, having a high voltage. In the example, the second booster stages 27 are sixty-four in number.

The decoding module 16 comprises a plurality of buffer stages 28, operating as inverters, each receiving a first pre-decoded address signal psxhv and supplying at an output, on the second transport bus 15, the negated version of the first pre-decoded address signal, designated by psxhvn. For instance, in the embodiment illustrated, a hundred and twenty-eight buffer stages 28 are present (which appropriately enable an increase of the fan-out at output from the first booster stages 26).

The decoding module 16 further comprises a plurality of logic-combination stages 29, each having a first input that receives a respective first negated pre-decoded address signal psxhvn from a respective buffer stage 28, a second input that receives a respective second pre-decoded address signal sxyhv from a respective second booster stage 27, and an output that supplies a respective decoded address signal $DAS_{HV}$.

Each logic-combination stage 29 implements an OR logic operation between the pre-decoded address signals to be combined received at the input: psxhvn and sxyhv.

The decoded address signal $DAS_{HV}$ thus has a high value (high voltage) when any one, or both, of the pre-decoded address signals to be combined, psxhvn and sxyhv, have a high value, and a low value (ground, GND) when both of the pre-decoded address signals to be combined, psxhvn and sxyhv, have a low value.

In the embodiment illustrated, the logic-combination stages 29 are five hundred and twelve in number, i.e., equal to the number of wordlines WL to be addressed (and to the total number of combinations between the pre-decoded address signals to be combined psxhvn and sxyhv).

The driving module 18 of the row decoder 5 comprises in this embodiment a plurality of inverters 30, each having an input that receives a respective decoded address signal $DAS_{HV}$ and an output that supplies the corresponding biasing signal S_WL for the respective wordlines WL of the memory array 2. The number of inverters 30 is equal to the number of the wordlines WL to be addressed, in the example, five hundred and twelve.

In detail, each inverter 30 comprises a first output transistor 31a, of a NMOS type, having its control terminal that receives the respective decoded address signal $DAS_{HV}$, its drain terminal that is connected to a respective wordline WL and on which the corresponding biasing signal S_WL is present, and its source terminal that receives a reference voltage $V_{ref}$, which may possibly have a negative value (or be equal to the ground reference GND). A second output transistor 31b, of a PMOS type, has its gate terminal that receives the respective decoded address signal $DAS_{HV}$, its drain terminal that is connected to the respective wordline WL and on which the corresponding biasing signal S_WL is present, and its source terminal that receives a boosted voltage, here designated by $V_x$, for example equal to the high voltage of 4.5 V.

To a low value of the decoded address signal $DAS_{HV}$ corresponds a high output of the inverter 30, with the corresponding biasing signal S_WL equal to the boosted voltage $V_x$. Instead, to a high value of the decoded address signal $DAS_{HV}$ corresponds a low output of the inverter 30, with the corresponding biasing signal S_WL equal to the reference voltage $V_{ref}$.

A more detailed description is now made, with reference to FIG. 4, of a known circuit embodiment of a logic-combination stage 29 of a standard CMOS type.

The logic-combination stage 29 comprises six MOS transistors, namely a first pair of input transistors, of a NMOS type, connected in parallel, and a second pair of input transistors, of a PMOS type, connected in series, which are designed to jointly implement the operation of OR logic combination of the pre-decoded address signals to be combined psxhvn and sxyhv received at the input, and a pair of output transistors, designed to supply on an output out the decoded address signal $DAS_{HV}$ according to the result of the aforesaid OR logic combination.

In particular, in the first pair of input transistors, a first NMOS transistor 32a is connected between a first reference line 33, set at a first reference potential, for example equal to the reference voltage $V_{ref}$, and an internal node 34, and receives on a respective control terminal a respective first negated pre-decoded address signal psxhvn, and a second NMOS transistor 32b is connected between the first reference line 33 and the internal node 34, and receives on the respective control terminal a respective second pre-decoded address signal sxyhv.

In the second pair of input transistors, a first PMOS transistor 32c and a second PMOS transistor 32d are connected in series between the internal node 34 and a second reference line 35, set at a second reference potential, for example equal to the boosted voltage $V_x$, and receive on a respective control terminal the second pre-decoded address signal sxyhv and the first negated pre-decoded address signal psxhvn, respectively. In the pair of output transistors, a pull-up PMOS transistor 32e is connected between the second reference line 35 and the output out, and has its control terminal connected to the internal node 34, and a pull-down PMOS transistor 32f is connected between the first reference line 33 and the same output out, and has its control terminal that is also connected to the internal node 34.

It is evident that the logic-combination stage 29 implements the following truth table in the OR logic combination of the pre-decoded address signals to be combined sxyhv and psxhvn:

| sxyhv | psxhvn | $DAS_{HV}$ |
|---|---|---|
| 1 | 1 | 1 |
| 1 | 0 | 1 |
| 0 | 1 | 1 |
| 0 | 0 | 0 |

In particular, when at least one of the pre-decoded address signals to be combined sxyhv and psxhvn has a high value, or when both of the pre-decoded address signals to be combined sxyhv and psxhvn have a high value, the internal node 34 is set at the reference potential (given the closed state of one or both of the NMOS transistors 32a, 32b of the first pair). Consequently, the pull-up PMOS transistor 32e is closed, and the output out goes to the high value (boosted voltage $V_x$).

When, instead, both of the pre-decoded address signals to be combined sxyhv and psxhvn have a low value, the internal node 34 is set at the high value (boosted voltage $V_x$), given the closed state of both of the PMOS transistors 32c, 32d of the second pair. Consequently, the pull-down PMOS transistor 32f is closed and the output out goes to the low value (reference voltage $V_{ref}$).

The present Applicant has realized that the row-decoding solution described previously has some limitations, in particular associated to a high occupation of area, which may prove important in applications where size reduction is required (for example, in portable applications).

BRIEF SUMMARY

One aim of the present disclosure is to overcome, at least in part, the problem highlighted previously in order to provide a row-decoding solution that will be more compact and will have a smaller area occupation.

According to the present disclosure, a row decoder and a corresponding non-volatile memory device are provided.

BRIEF DESCRIPTION OF THE SEVERAL VIEWS OF THE DRAWINGS

For a better understanding of the present disclosure, and preferred embodiments thereof are now described purely by way of non-limiting example, with reference to the attached drawings, wherein:

FIG. 6a shows a circuit diagram of a logic-combination stage in the row decoder of FIG. 5a ;

DETAILED DESCRIPTION

The present Applicant has realized that the decoding module and the corresponding plurality of logic-combination stages, one for each wordline WL to be addressed (see the foregoing discussion and FIGS. 3 and 4) represent an important contribution to the total area occupation of the row decoder.

One aspect of the present solution thus envisages a dedicated implementation (a so-called "custom" implementation) for the logic-combination stages of the decoding module, aimed at reducing area occupation of the row decoder.

Figure 3:
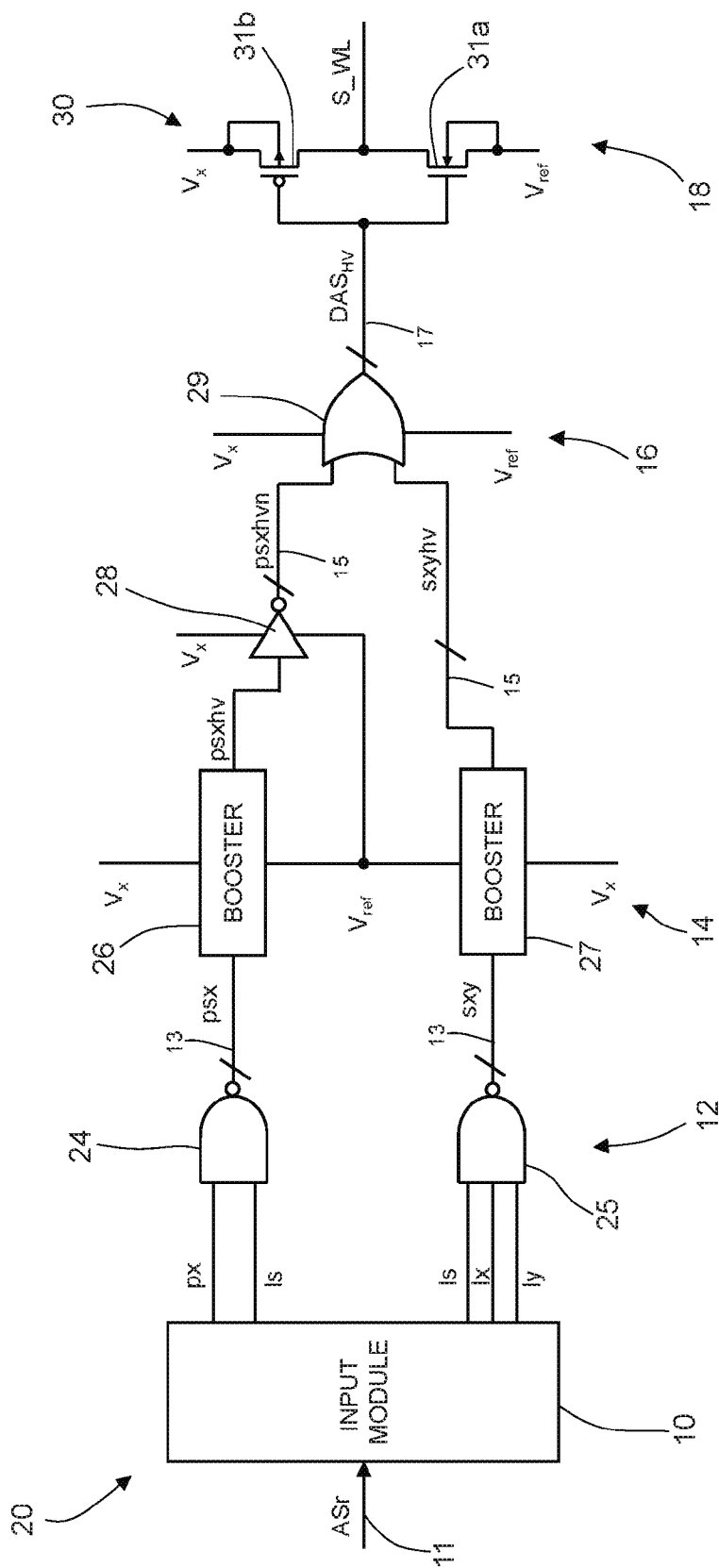
FIG. 3 shows a more detailed block diagram of the row decoder of FIG. 2.
Figure 4:
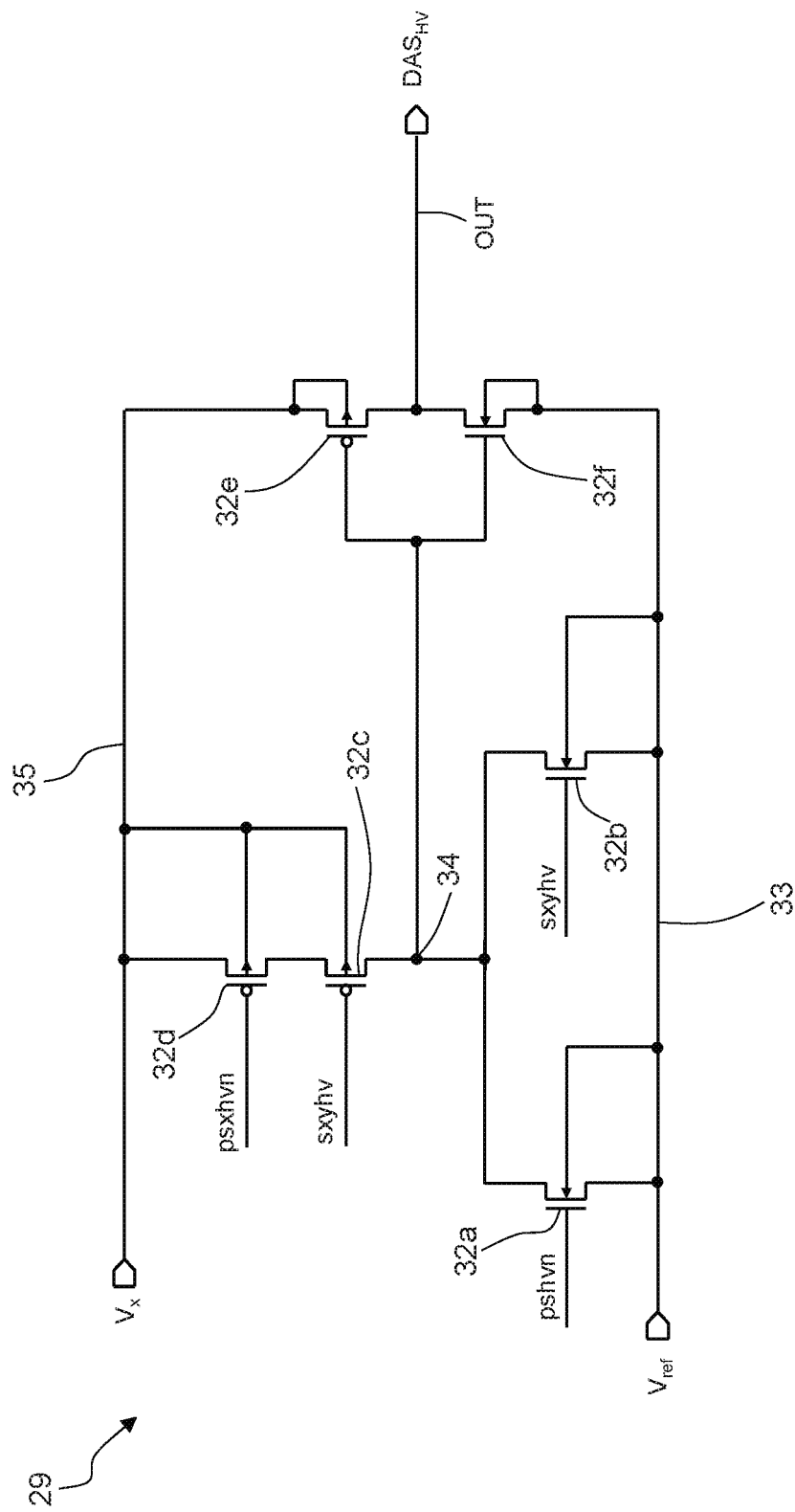
FIG. 4 shows a circuit diagram of a logic-combination stage in the row decoder of FIG. 3.

In particular, each logic-combination stage is designed for generating the decoded address signals $DAS_{HV}$ by implementing the same operation of logic combination of the pre-decoded address signals as that of the known embodiment discussed with reference to FIG. 3 (so as not to require further circuit modifications), i.e., the logic OR between the first negated predecoded address signals psxhvn and the second predecoded address signals sxyhv (note that the first negated predecoded address signals psxhvn and the second predecoded address signals sxyhv are referred to in what follows also as "first and second predecoded address signals to be combined psxhvn, sxyhv"):

$DAS_{HV}$=(psxhvn) OR (sxyhv).

Each logic-combination stage thus implements the truth table referred to above:

| sxyhv | psxhvn | $DAS_{HV}$ |
|---|---|---|
| 1 | 1 | 1 |
| 1 | 0 | 1 |
| 0 | 1 | 1 |
| 0 | 0 | 0 |

In particular, and as will be highlighted hereinafter, each of the logic-combination stages has three signal inputs, which are designed to receive: one between a first and a second predecoded address signal to be combined psxhvn, sxyhv, and its negated version; and the other between a first and a second predecoded address signal to be combined psxhvn, sxyhv, or its negated version.

As will be described in greater detail hereinafter, the logic-combination stages are configured to have an occupation of area halved as compared to traditional solutions, and include three MOS transistors as opposed to six transistors of the traditional solutions.

The logic-combination stages include at least one MOS transfer transistor (also referred to as "pass transistor"), having the function of selectively transferring onto the output out the value of one between a first and a second predecoded address signal to be combined psxhvn, sxyhv, in at least one operating condition. In particular, the MOS pass transistor is controlled by the negated version of the other between a first and a second predecoded address signal to be combined psxhvn, sxyhv.

The logic-combination stages include at least one pull-up MOS transistor, which is controlled by the negated version of the other between a first and a second predecoded address signal to be combined psxhvn, sxyhv, and has the function of selectively bringing to the high state the output out, in at least one operating condition.

Figure 1:
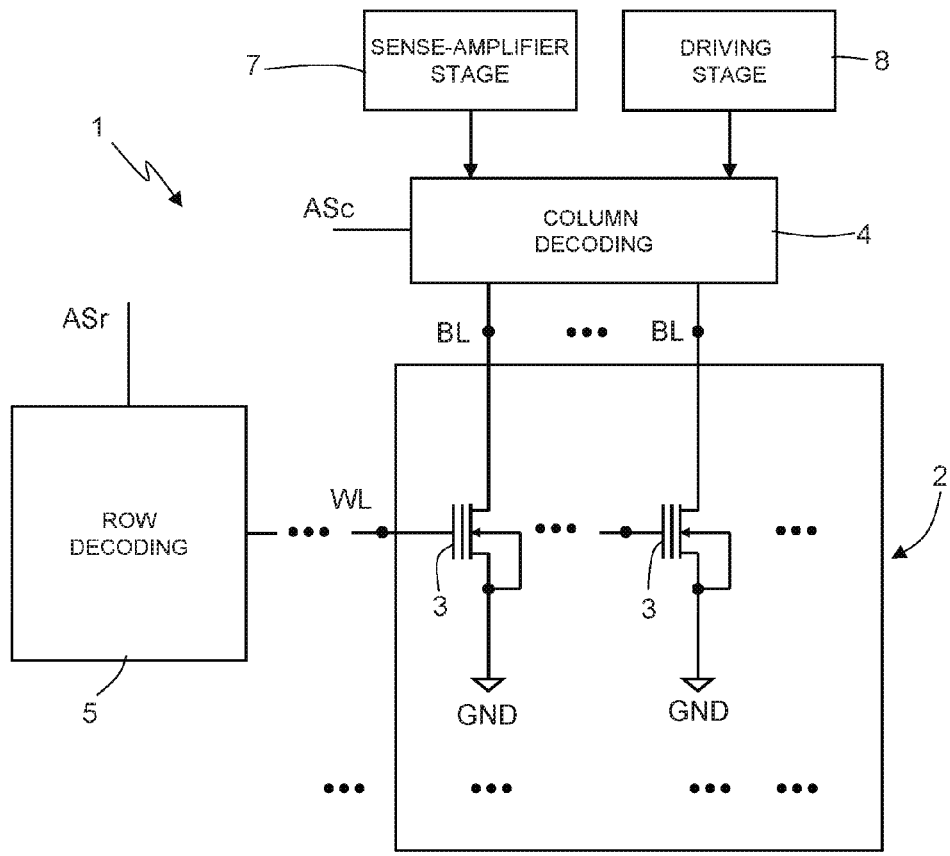
FIG. 1 shows a general block diagram of a non-volatile memory device of a known type.
Figure 5A:
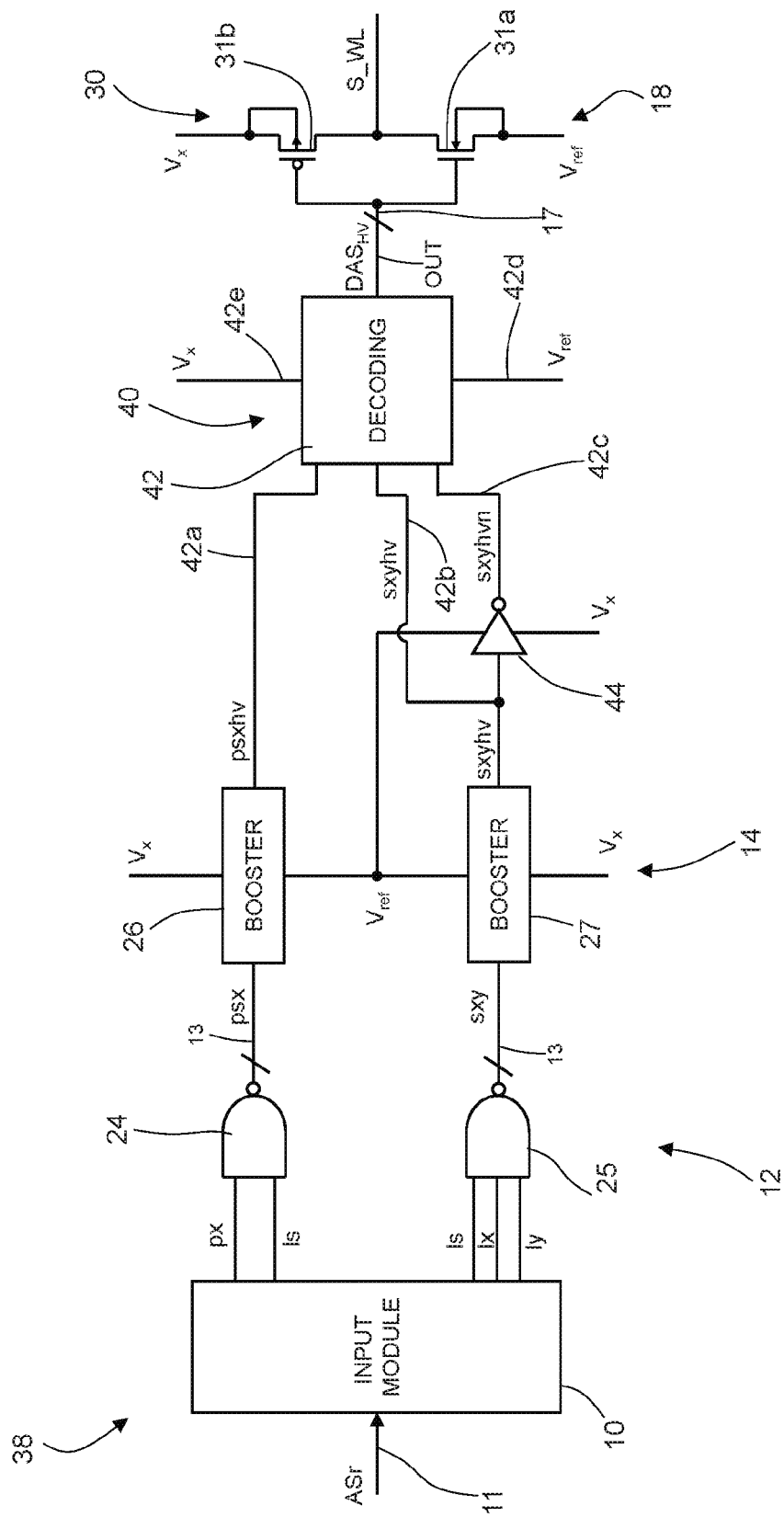
FIG. 5a shows a block diagram of a row decoder according to a first embodiment of the present solution.

In greater detail, and as illustrated in FIG. 5a (where elements that are similar to others already illustrated are designated by the same reference numbers and are not described again herein), in a first embodiment, the row decoder, here designated by 38, includes in a way substantially similar to what has been discussed previously:

the input stage 10, which generates, based on the row address signals $AS_r$, the address signals px, lx, ly and ls;

the pre-decoding module 12, with the plurality of first logic gates 24 (in the example, eight in number), each of which receives at the inputs a respective first address signal px and a respective fourth address signal ls and supplies at the output a respective first low-voltage pre-decoded address signal psx. The plurality of second logic gates 25 (in the example, sixty-four in number), each of which receives at the inputs a respective second address signal lx, a respective third address signal ly, and a respective fourth address signal ls, and supplies at the output a second low-voltage pre-decoded address signal sxy;

the booster module 14, with the plurality of first booster stages 26 (in the example, eight in number), each having an input that receives a respective first low-voltage pre-decoded address signal psx and an output that supplies a respective first pre-decoded address signal psxhv; and the plurality of second booster stages 27 (in the example, sixty-four in number), each having an input that receives a respective second low-voltage pre-decoded address signal sxy and an output that supplies a respective second pre-decoded address signal sxyhv; and the driving module 18, with the plurality of inverters 30 (the number of the wordlines WL to be addressed, in the example, being five hundred and twelve), each having an input that receives a respective decoded address signal $DAS_{HV}$ and an output that supplies the corresponding biasing signal S_WL for the respective wordlines WL of the memory array 2 (FIG. 1).

In the first embodiment, the decoding module, designated herein by 40, arranged between the booster module 14 and the driving module 18, includes a plurality of logic-combination stages 42. Each logic-combination stage has a first input 42a that receives a respective first pre-decoded address signal psxhv from the first booster stages 26; a second input 42b that receives a respective second pre-decoded address signal sxyhv from the second booster stages 27; a third input 42c that receives the second negated pre-decoded address signal sxyhvn (generated as discussed hereinafter); and an output out that supplies a respective decoded address signal $DAS_{HV}$.

It is emphasized once again that the negated version (psxhvn) of the first pre-decoded address signal psxhv constitutes the first predecoded address signal to be combined, and the second pre-decoded address signal sxyhv constitutes the second predecoded address signal to be combined by the logic-combination stage 42.

Each logic-combination stage 42 further has a fourth input 42d, designed to receive the reference voltage $V_{ref}$, and a fifth input 42e designed to receive the boosted voltage $V_x$.

The decoding module 40 includes in this case a plurality of first buffer stages 44 (in the example, sixty-four in number) operating as inverters, each receiving a second pre-decoded address signal sxyhv from the second booster stages 27, and supplying at output the negated version of the same second pre-decoded address signal: sxyhvn. Instead, in this case no buffer stages at output from the first booster stages 26 are present.

Figure 6A:
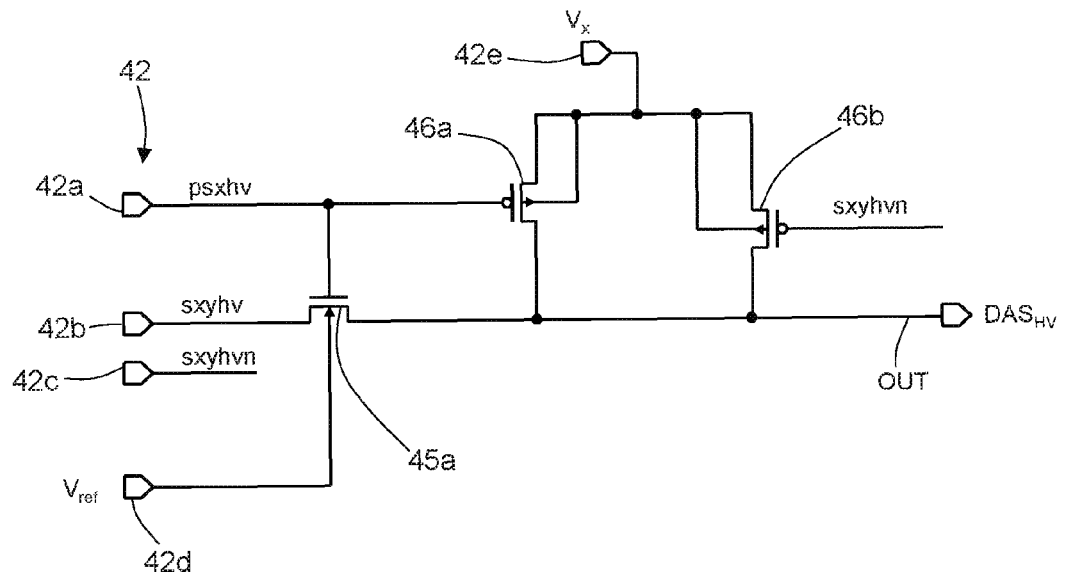

With reference to FIG. 6a, a corresponding first embodiment is now described for the logic-combination stages 42, each comprising in this case:

a single pass transistor 45a, of a NMOS type, which is connected between the second input 42b, on which it receives the second pre-decoded address signal sxyhv, and the output out, and has its control terminal that is connected to the first input 42a and receives the first pre-decoded address signal psxhv; and a pair of pull-up PMOS transistors that are connected in parallel between the output out and the fifth input 42e, the pair being formed by a first pull-up transistor 46a, having its control terminal that is connected to the first input 42a and receives the first pre-decoded address signal psxhv, and by a second pull-up transistor 46b, having its control terminal that is connected to the third input 42c and receives the second negated pre-decoded address signal sxyhvn.

The bulk terminal of the pass transistor 45a is biased at the reference voltage $V_{ref}$ (being coupled to the fourth input 42d), whereas the bulk terminal of the pull-up transistors 46a, 46b is biased at the boosted voltage $V_x$ (being coupled to the fifth input 42e).

The circuit configuration described enables implementation of the truth table discussed above, given that:

when the first pre-decoded address signal to be combined psxhvn and the second pre-decoded address signal to be combined sxyhv are both high, the first and second pull-up transistors 46a, 46b are closed and the output out is set at the high value;

when the first pre-decoded address signal to be combined psxhvn has a low value and the second pre-decoded address signal to be combined sxyhv is high, the second pull-up transistor 46b is closed, so as the pass transistor 45a, and the output out is again set at the high value;

in the case where the first pre-decoded address signal to be combined psxhvn is high and the second pre-decoded address signal to be combined sxyhv has a low value, the first pull-up transistor 46a is closed and brings the output out to the high value; and when both the first pre-decoded address signal to be combined psxhvn and the second pre-decoded address signal to be combined sxyhv have a low value, only the pass transistor 45a is closed, thus bringing the output out to a low value.

It should further be noted that the circuit embodiment described is such as not to enable setting-up of a direct conduction path (which is potentially destructive) between the line set at the boosted voltage $V_x$ and the line set at the reference potential $V_{ref}$.

Figure 5B:
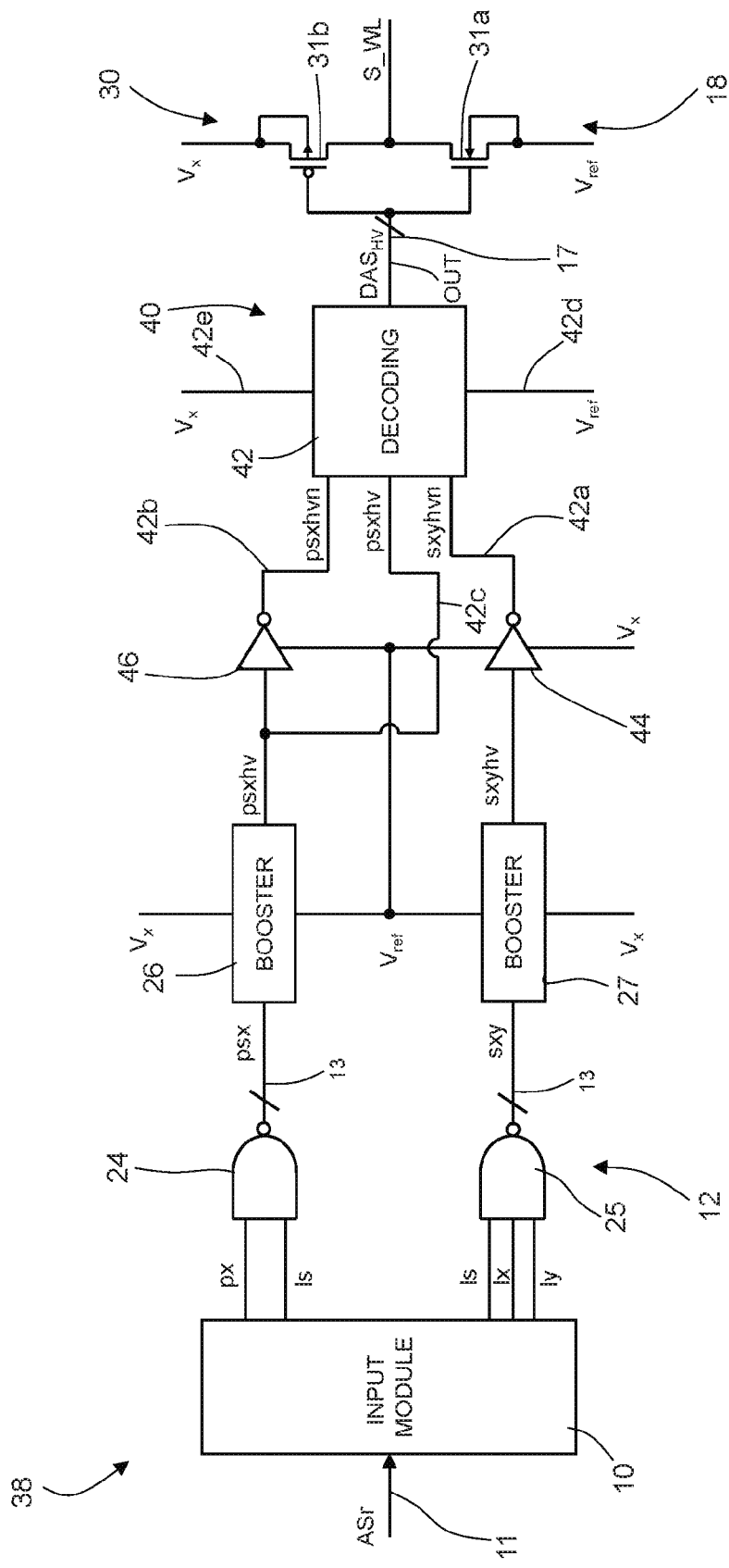
FIG. 5b shows a block diagram of a row decoder according to a second embodiment of the present solution.

With reference to FIG. 5b, a second embodiment of the row decoder 38 is now described, in which the decoding module 40 further comprises a plurality of second buffer stages 46 (in the example, a hundred and twenty-eight), each receiving a first pre-decoded address signal psxhv from the first booster stages 26, and supplying at the output the negated version of the same first pre-decoded address signal, psxhvn.

Each logic-combination stage 42 has in this case: a first input 42a that receives a respective second negated pre-decoded address signal sxyhvn from the first buffer stages 44; a second input 42b that receives a respective first negated pre-decoded address signal psxhvn from the second buffer stages 46; and a third input 42c that receives the respective first pre-decoded address signal psxhv from the first booster stages 26.

Figure 6B:
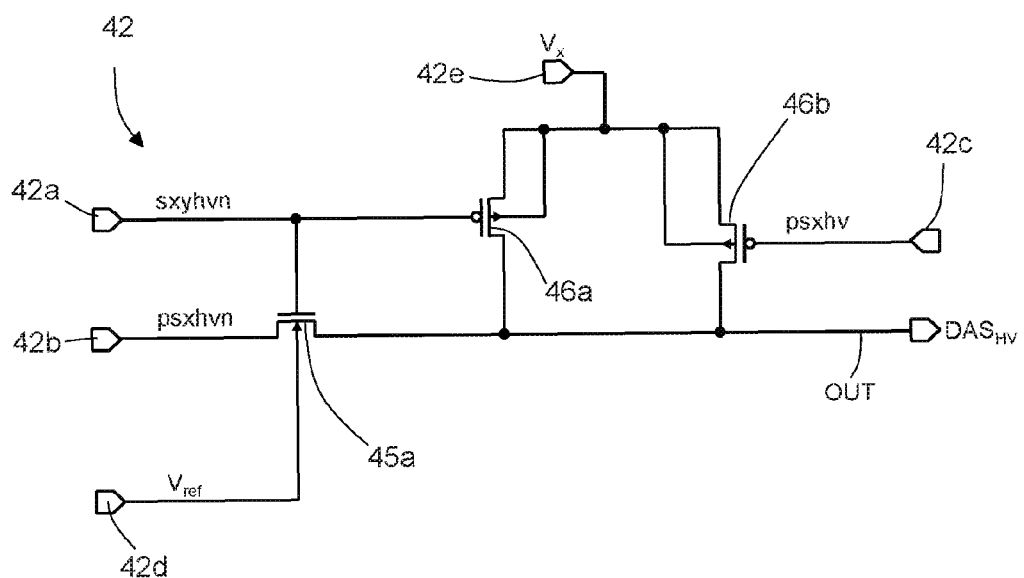
FIG. 6b shows a circuit diagram of a logic-combination stage in the row decoder of FIG. 5b.

As illustrated in FIG. 6b, a corresponding second embodiment for the logic-combination stage 42 (which is, from the circuit standpoint, similar to the first embodiment) envisages in this case that:

the single pass transistor 45a, of a NMOS type, receives from the second input 42b the first negated pre-decoded address signal psxhvn, and has a control terminal that receives the second negated pre-decoded address signal sxyhvn; and the first pull-up transistor 46a has a control terminal that receives the second negated pre-decoded address signal sxyhvn, and the second pull-up transistor 46b has a control terminal that receives the first pre-decoded address signal psxhv.

It may be noted, in a way substantially similar to what has been discussed with reference to the first embodiment, that also this circuit configuration enables implementation of the desired truth table for the OR logic combination of the high predecoded address signals to be combined psxhvn, sxyhv, and in particular that:

in the case where the first pre-decoded address signal to be combined psxhvn and the second pre-decoded address signal to be combined sxyhv are high, the first and second pull-up transistors 46a, 46b are both closed, and the output out is at the high value;

when the first pre-decoded address signal to be combined psxhvn has a low value and the second pre-decoded address signal to be combined sxyhv is high, the first pull-up transistor 46a is closed and the output out is at the high value;

in the case where the first pre-decoded address signal to be combined psxhvn is high and the second pre-decoded address signal to be combined sxyhv has a low value, both the pass transistor 45a and the second pull-up transistor 46b are closed, so that the output out is at the high value; and when both the first pre-decoded address signal to be combined psxhvn and the second pre-decoded address signal to be combined sxyhv have a low value, the single pass transistor 45a is closed, thus bringing the output out to the low value.

Figure 5C:
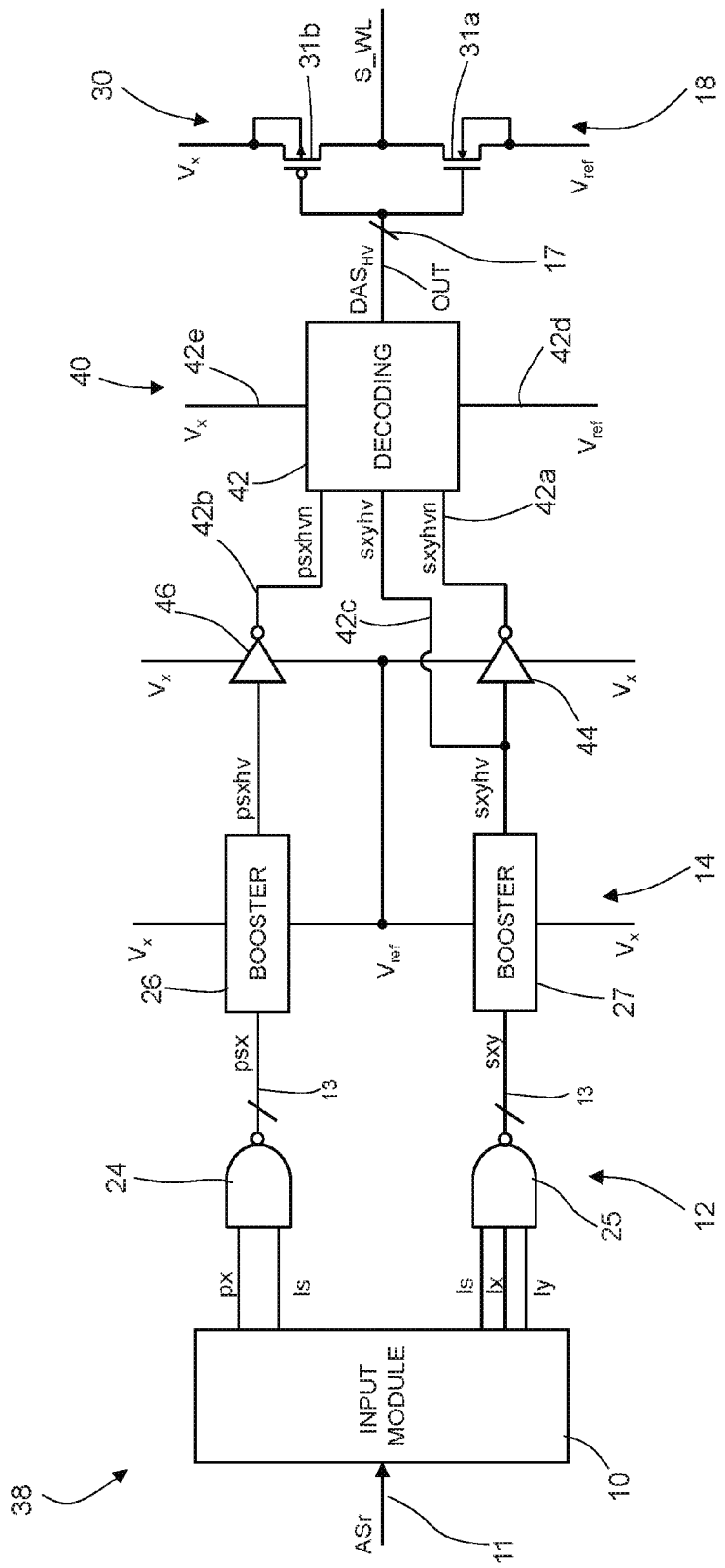
FIG. 5c shows a block diagram of a row decoder according to a third embodiment of the present solution.

With reference to FIG. 5c, a third embodiment of the row decoder 38 is now described, in which the decoding module 40 again comprises both the first and the second buffer stages 44, 46.

Each logic-combination stage 42 has in this case: a first input 42a that receives a respective second negated pre-decoded address signal sxyhvn from the first buffer stages 44; a second input 42b that receives a first negated pre-decoded address signal psxhvn from the second buffer stages 46; and a third input 42c that receives the respective second pre-decoded address signal sxyhv from the second booster stages 27.

Figure 6C:
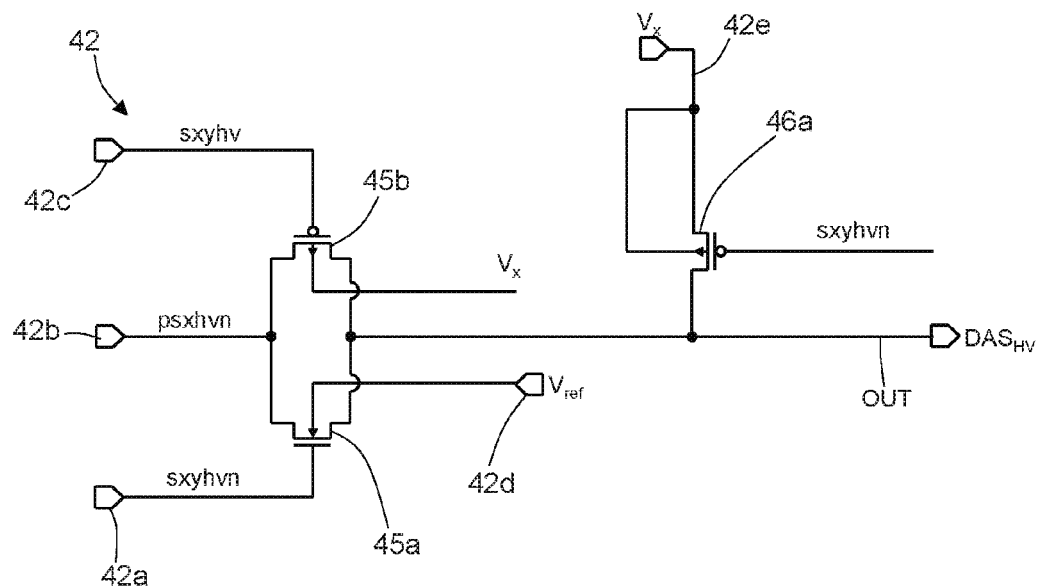
FIG. 6c shows a circuit diagram of a logic-combination stage in the row decoder of FIG. 5c.

As illustrated in FIG. 6c, the logic-combination stage 42 in a corresponding third embodiment comprises:

a pair of pass transistors, connected between the second input 42b and the output out, and in particular a first pass transistor 45a, of a NMOS type, which has its control terminal that is connected to the first input 42a and receives the second negated pre-decoded address signal sxyhvn, and a second pass transistor 45b, of a PMOS type, having its control terminal that is connected to the third input 42c and receiving the second pre-decoded address signal sxyhv; and a single pull-up transistor 46a, of a PMOS type, connected between the output out and the fifth input 42e, having its control terminal that is connected to the first input 42a and receives the second negated pre-decoded address signal sxyhvn.

Also for this third embodiment, it may be noted that it implements the truth table of the operation of OR logic combination of the pre-decoded address signals to be combined psxhvn and sxyhv, and in particular that:

when the first pre-decoded address signal to be combined psxhvn and the second pre-decoded address signal to be combined sxyhv are both high, the pull-up transistor 46a is closed, and the output out is at the high value;

when the first pre-decoded address signal to be combined psxhvn has a low value and the second pre-decoded address signal to be combined sxyhv is high, again the pull-up transistor 46a is closed and the output out is at the high value;

in the case where the first pre-decoded address signal to be combined psxhvn is high and the second pre-decoded address signal to be combined sxyhv has a low value, the first and second pass transistors 45a, 45b are closed, bringing the output out to the high value (corresponding to the value of the first pre-decoded address signal to be combined psxhvn); and when both the first pre-decoded address signal to be combined psxhvn and the second pre-decoded address signal to be combined sxyhv have a low value, the first and second pass transistors 45a, 45b are again closed, in this case bringing the output out to a low value (corresponding to the value of the first pre-decoded address signal to be combined psxhvn).

Figure 5D:
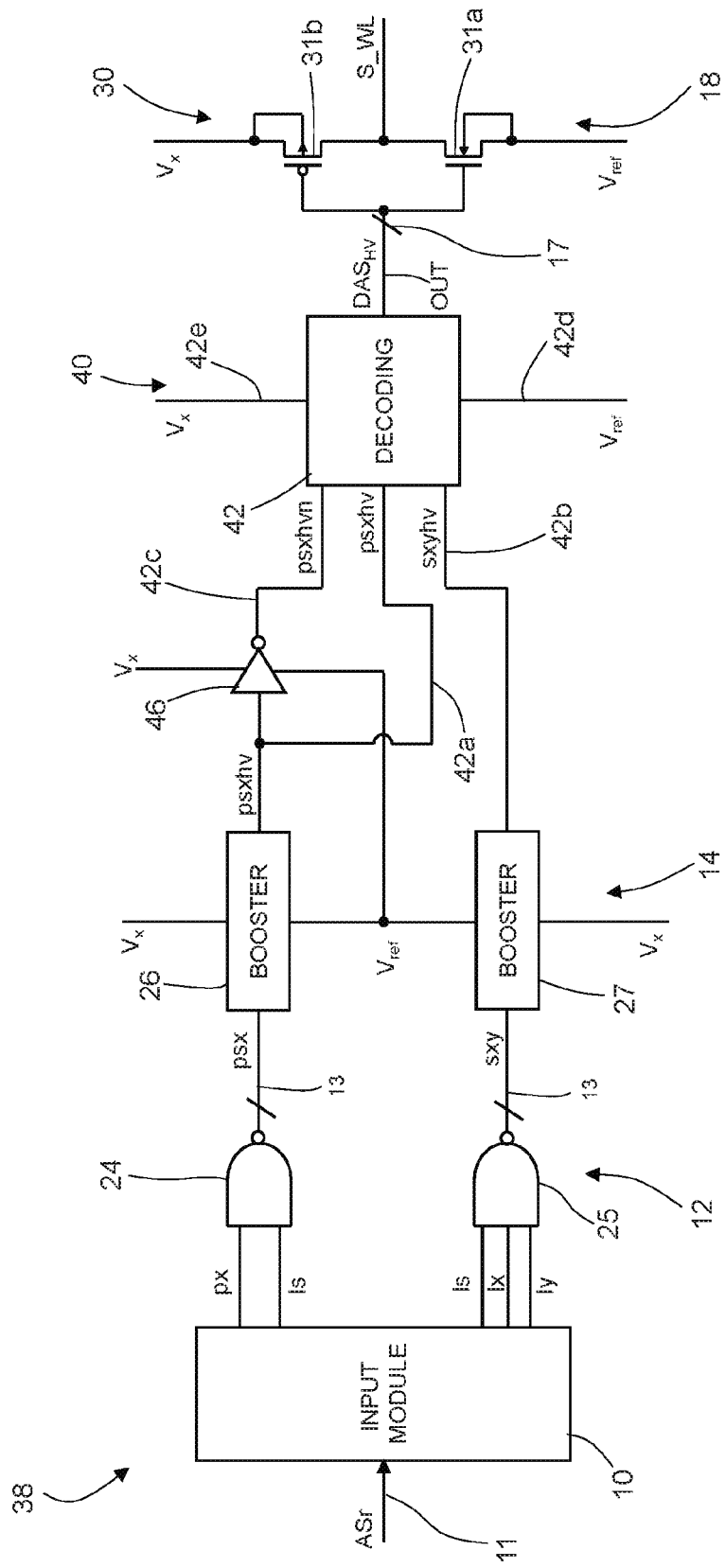
FIG. 5d shows a block diagram of a row decoder according to a fourth embodiment of the present solution.

With reference first to FIG. 5d a fourth embodiment of the present solution is now discussed, in which the decoding module 40 only comprises the second buffer stages 46 (the first buffer stages 44 in this case are not present).

Each logic-combination stage 42 has in this case: a first input 42a that receives a respective first pre-decoded address signal psxhv from the first booster stages 26; a second input 42b that receives a respective second pre-decoded address signal sxyhv from the second booster stages 27; and a third input 42c that receives the respective first negated pre-decoded address signal psxhvn from the second buffer stages 46.

Figure 6D:
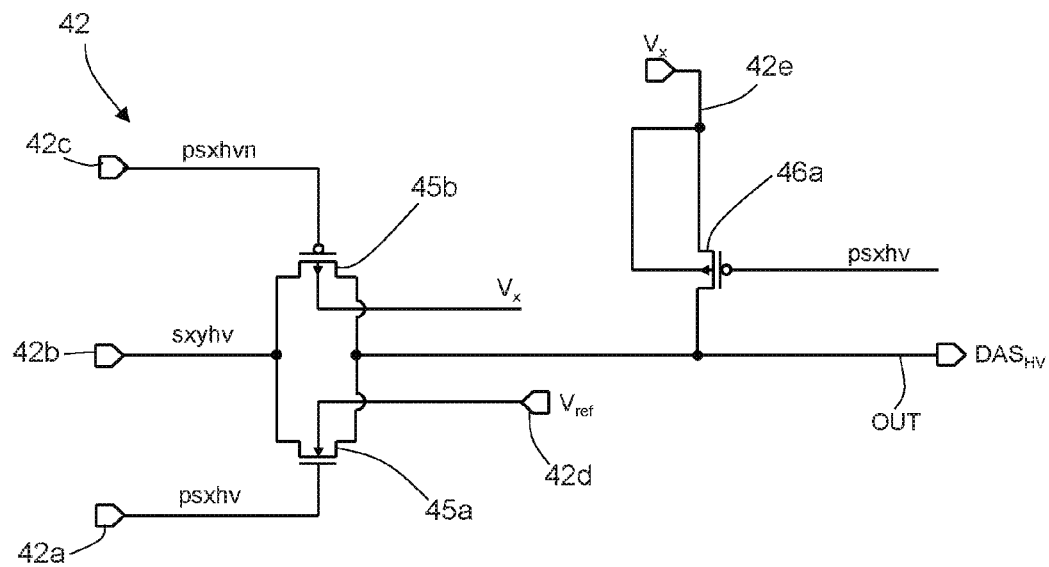
FIG. 6d shows a circuit diagram of a logic-combination stage in the row decoder of FIG. 5d .

As illustrated in FIG. 6d, a corresponding fourth embodiment of the logic-combination stage 42 is substantially similar to the third embodiment illustrated with reference to FIG. 6c, and thus comprises:

the pair of pass transistors, connected between the second input 42b, on which the second pre-decoded address signal sxyhv is present and the output out, with the first pass transistor 45a having its control terminal that is connected to the first input 42a and receiving the first pre-decoded address signal psxhv, and the second pass transistor 45b having its control terminal that is connected to the third input 42c and receiving the first negated pre-decoded address signal psxhvn; and the single pull-up transistor 46a having its control terminal that is connected to the first input 42a and receiving the first pre-decoded address signal psxhv.

Also for this fourth embodiment, the truth table of the same operation of OR logic combination of the pre-decoded address signals to be combined psxhvn and sxyhv is implemented, given that:

when the first pre-decoded address signal to be combined psxhvn and the second pre-decoded address signal to be combined sxyhv are both high, the pull-up transistor 46a is closed, and the output out is at the high value;

when the first pre-decoded address signal to be combined psxhvn has a low value and the second pre-decoded address signal to be combined sxyhv is high, the first and second pass transistors 45a, 45b are closed and the high value of said second pre-decoded address signal to be combined sxyhv is transferred to the output out;

in the case where the first pre-decoded address signal to be combined psxhvn is high and the second pre-decoded address signal to be combined sxyhv has a low value, the pull-up transistor 46a is again closed, bringing the output out to the high value; and when both the first pre-decoded address signal to be combined psxhvn and the second pre-decoded address signal to be combined sxyhv have a low value, the first and second pass transistors 45a, 45b are closed, in this case bringing the output out to the low value as that of said second pre-decoded address signal to be combined sxyhv.

The advantages of the row decoder are clear from the foregoing description.

In any case, it is emphasized once again that the solution proposed enables reduction of the occupation of area of the row decoder 38 in a non-volatile memory device, in particular of a flash type.

This reduction of area occupation is principally afforded by the substantial halving of the dimensions of the logic-combination stages 42 in the final part of the same row decoder 38.

Figure 2:
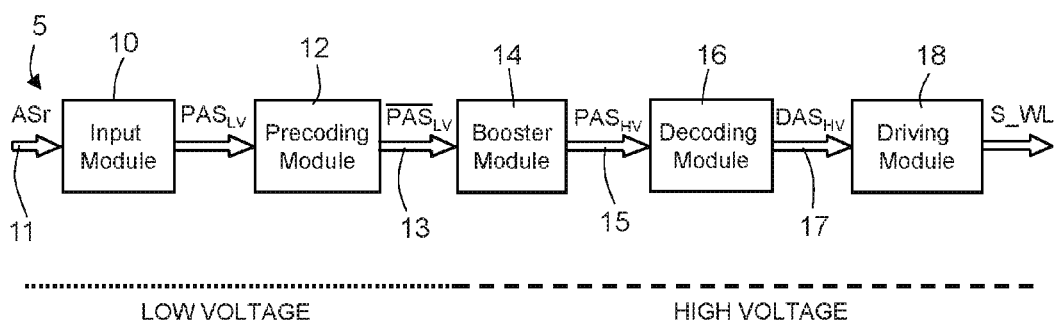
FIG. 2 shows a general block diagram of a row decoder in the memory device of FIG. 1, which is also of a known type.

In particular, the present Applicant has realized that, given the same performance as compared to known solutions (for example, the solution described with reference to FIGS. 2 and 3), it is possible to obtain a reduction of area of around 20% for the entire row decoder 38.

It is to be noted that removal of the first buffer stage 44 or the second buffer stage 46 may contribute to the total reduction of area, at least in some embodiments; this removal may be accompanied, however, by an increase in the area of the first or second booster stages 26, 27 (in particular, of the corresponding output portion, principally for reasons of fan-out, as will be evident to a person skilled in the field).

The present Applicant further has realized that, given the same area as compared to traditional embodiments, the present solution alternatively enables an increase to be obtained in the speed of the decoding operations performed by the row decoder 38 of around 30% of the total decoding time.

The aforesaid increase in speed may be achieved principally via increase of the area of the transistors of the inverters 30 in the driving module 18 of the row decoder 38 (this increase in turn being allowed by the aforementioned reduction of the area of the logic-combination stages 42).

Finally, it is clear that modifications and variations may be made to what has been described and illustrated herein, without thereby departing from the scope of the present disclosure, as defined in the annexed claims.

In particular, it is evident that, depending on the dimensions of the memory array 2 (and the corresponding division into sectors), a different number of wordlines WL to be addressed may be provided, and, consequently, a different number of pre-decoding and coding signals.

Furthermore, it is emphasized once again that the solution described may be applied in a wide range of non-volatile memory devices (for example, embedded or stand-alone flash devices), where a reduced occupation of area is required.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A row decoder for a non-volatile memory device, comprising:
an input and pre-decoding module configured to receive address signals and to generate pre-decoded address signals;
a decoding module configured to receive said pre-decoded address signals and to generate decoded address signals having a high or low value according to a decoding operation; and
a driving module configured to generate biasing signals for biasing of wordlines of a memory array starting from said decoded address signals;
wherein said decoding module includes a plurality of decoding stages, each of the decoding stages configured to carry out an OR logic combination of a first predecoded address signal and a second predecoded address signal to be combined and to generate the corresponding decoded address signal on an output of the decoding stage based on the OR logic combination of the first and second predecoded address signals, and each decoding stage including:
at least one first pass transistor configured to transfer selectively onto the output as the corresponding decoded address signal one of the first and second predecoded address signals to be combined in at least one first operating condition; and
at least one first pull-up transistor configured to selectively drive the corresponding decoded address signal on the output to the high value in at least one second operating condition.

2. The row decoder according to claim 1, wherein said first pass transistor and said first pull-up transistor are controlled by the negated version of the other between the first and second predecoded address signals to be combined.

3. The row decoder according to claim 1, wherein said first pass transistor is an NMOS type and said first pull-up transistor is a PMOS type.

4. The row decoder according to claim 1, wherein each decoding stage comprises only three transistors, which include said first pass transistor, said first pull-up transistor, and a second pull-up transistor coupled to the first pull-up transistor or a second pass transistor coupled to the first pass transistor.

5. The row decoder according to claim 4, wherein each decoding stage has a first input configured to receive said negated version of the other between the first and second predecoded address signals to be combined, and a second input configured to receive said one between the first and second predecoded address signals to be combined; wherein said first pass transistor is connected between the second input and the output and has its control terminal coupled to said first input, and said first pull-up transistor is connected between said output and a further input set at a boosted voltage and has its control terminal coupled to said first input.

6. The decoder according to claim 5, wherein said decoding stage comprises said first pass transistor, said first pull-up transistor, and moreover a second pull-up transistor, which is connected in parallel to said first pull-up transistor between said output and said further input and has its control terminal designed to receive the negated version of the one between the first and second predecoded address signals to be combined.

7. The decoder according to claim 5, wherein said decoding stage comprises said first pass transistor, said first pull-up transistor, and a second pass transistor which is connected in parallel to said first pass transistor between said second input and said output and has its control terminal that is coupled to a third input of said decoding stage and is designed to receive the other between the first and second predecoded address signals to be combined.

8. The decoder according to claim 1, wherein said decoding module is configured to receive from said input and pre-decoding module the negated version of the first predecoded address signals to be combined, and the second predecoded address signals to be combined, and further comprises first buffer stages and/or second buffer stages which are designed to invert said second predecoded address signals to be combined and/or said negated version of the first predecoded address signals to be combined and have outputs coupled to said decoding stages.

9. The decoder according to claim 1, wherein each decoding stage has three inputs: a first input designed to receive the negated version of the other between the first and second predecoded address signals to be combined; a second input designed to receive the one between the first and second predecoded address signals to be combined; and a third input designed to receive the negated version of the one between the first and second predecoded address signals to be combined or the other between the first and second predecoded address signals to be combined.

10. The decoder according to claim 1, wherein said input and pre-decoding module comprises:
an input module configured to receive the address signals and group together said address signals into subsets for generating grouped address signals;
a pre-decoding module configured to receive the grouped address signals and logically combine said grouped address signals for generating low-voltage pre-decoded address signals; and
a booster module configured to receive said low-voltage pre-decoded address signals and carry out a voltage-boosting operation for generation of said pre-decoded address signals.

11. The decoder according to claim 1, wherein said driving module comprises a plurality of inverter units, one for each of said wordlines; wherein each of said inverter units is configured to receive a respective decoded address signal and supply a respective biasing signal for the respective wordline of the memory array.

12. A non-volatile memory device, comprising:
a memory array including a plurality of memory cells and a plurality of wordlines and bitlines coupled to the memory cells;
a column decoder coupled to the bitlines of the memory array and configured to receive a column address; and
a row decoder coupled to the wordlines of the memory array and configured to receive a row address, the row decoder including a plurality of decoding stages, each decoding stage configured to perform a logical OR operation on first and second predecoded address signals to be combined to generate on an output of the decoding stage a decoded address signal to be applied to a corresponding wordline, each decoding stage including:
at least one first pass transistor configured to transfer the second predecoded address signal onto the output as the decoded address signal responsive to the first predecoded address signal having a first value; and
at least one first pull-up transistor configured to drive the decoded address signal on the output to a set value responsive to the first predecoded address signal having a second value.

13. The non-volatile memory device according to claim 12, wherein said memory array is of a NAND or NOR flash type.

14. The non-volatile memory device according to claim 12 further comprising:
a sense-amplifier coupled to the column decoder and configured to operation in combination with the column decoder to provide a read path for an addressed memory cell in the memory array and compare a current flowing through the addressed memory cell with a reference current to detect a value of a data stored in the addressed memory cell; and
a driving stage circuit coupled to the column decoder and configured to operate in combination with the column decoder to provide a programming path to supply required biasing quantities on the bitlines for programming the addressed memory cell in the memory array.

15. The non-volatile memory device according to claim 12, wherein the at least one first pull-up transistor comprises first and second pull-up transistors coupled between the output and node configured to receive a boosted voltage, the boosted voltage having a magnitude corresponding to the set value.

16. The non-volatile memory device according to claim 12, wherein the first value of the first predecoded address signal is a negated version of the first predecoded address signal.

17. A method, comprising:
performing a logical OR operation on a first predecoded address signal and a second predecoded address signal to generate a decoded address signal to drive a corresponding wordline of a memory array of non-volatile memory cells;
providing a selected one of the first and second predecoded address signals as the decoded address signal responsive to the first and second predecoded address signals having a first operating condition; and
driving the decoded address signal to a boosted voltage responsive to the first and second predecoded address signals having a second operating condition.

18. The method of claim 17, wherein providing the selected one of the first and second predecoded address signals as the decoded address signal comprises providing the second predecoded address signal as the decoded address signal responsive to the first predecoded address signal.

19. The method of claim 17, wherein providing the selected one of the first and second predecoded address signals as the decoded address signal comprises providing the first predecoded address signal as the decoded address signal responsive to the complement of the second predecoded address signal.

20. The method of claim 17, wherein providing the selected one of the first and second predecoded address signals as the decoded address signal comprises providing the first predecoded address signal as the decoded address signal responsive to the second predecoded address signal and the complement of the second predecoded address signal.

21. The method of claim 17, wherein providing the selected one of the first and second predecoded address signals as the decoded address signal comprises providing the second predecoded address signal as the decoded address signal responsive to the first predecoded address signal and the complement of the first predecoded address signal.

22. The method of claim 17, wherein driving the decoded address signal to the boosted voltage responsive to the first and second predecoded address signals having the second operating condition comprises one of:

driving the decoded address signal to the boosted voltage responsive to the first predecoded address signal having a first logic value and a complement of the second predecoded address signal having the first logic value;

driving the decoded address signal to the boosted voltage responsive to the complement of the second predecoded address signal having the first logic value and the first predecoded address signal having the first logic value;

driving the decoded address signal to the boosted voltage responsive to the complement of the second predecoded address signal having the first logic value; and driving the decoded address signal to the boosted voltage responsive to the first predecoded address signal having the first logic value.

\* \* \* \* \*